United States Patent
Park

(10) Patent No.: US 12,426,173 B2
(45) Date of Patent: Sep. 23, 2025

(54) BATTERY CASE AND ELECTRONIC PRICE INDICATOR INCLUDING THE SAME

(71) Applicant: SOLUM CO., LTD., Yongin-si (KR)

(72) Inventor: Sang Baek Park, Yongin-si (KR)

(73) Assignee: SOLUM CO., LTD., Yongin-si (KR)

( * ) Notice: Subject to any disclaimer, the term of this patent is extended or adjusted under 35 U.S.C. 154(b) by 0 days.

(21) Appl. No.: 18/629,435

(22) Filed: Apr. 8, 2024

(65) Prior Publication Data

US 2024/0260206 A1 Aug. 1, 2024

Related U.S. Application Data

(63) Continuation of application No. 17/661,068, filed on Apr. 28, 2022, now Pat. No. 11,985,772.

(30) Foreign Application Priority Data

| Apr. 29, 2021 | (KR) | .................. | 10-2021-0055954 |
| Mar. 10, 2022 | (KR) | .................. | 10-2022-0030333 |

(51) Int. Cl.
*H05K 5/00* (2025.01)

(52) U.S. Cl.
CPC ................................ *H05K 5/0086* (2013.01)

(58) Field of Classification Search
CPC . G09F 3/208; H01M 50/247; H01M 2220/30; H01M 50/213; H01M 50/267; H02J 7/0013; H02J 7/0063; H05K 5/0017; H05K 5/0086; Y02E 60/10
See application file for complete search history.

(56) References Cited

U.S. PATENT DOCUMENTS

| 5,505,635 | A | 4/1996 | Willlows et al. |
| 5,771,005 | A | 6/1998 | Goodwin, III |
| 5,904,414 | A * | 5/1999 | Monteleone ............ F21L 4/005 |
| | | | 362/208 |
| 6,293,463 | B1 | 9/2001 | Kato et al. |
| 6,829,495 | B2 | 12/2004 | Lee |
| 6,955,446 | B2 | 10/2005 | Uke |

(Continued)

FOREIGN PATENT DOCUMENTS

| CN | 209843850 | 12/2019 |
| CN | 111326684 | 6/2020 |

OTHER PUBLICATIONS

European Search Report, Application No. 22168400.4, dated Dec. 9, 2022.

*Primary Examiner* — Sagar Shrestha
(74) *Attorney, Agent, or Firm* — Perman & Green, LLP

(57) ABSTRACT

A battery case includes: a first battery accommodating portion accommodating at least one first battery; a second battery accommodating portion arranged apart from the first battery accommodating portion and accommodating at least one second battery serially connected with the at least one first battery; a rail arranged between the first battery accommodating portion and the second battery accommodating portion; and a structure configured to move along the rail between the first battery accommodating portion and the second battery accommodating portion and prevent contact between same terminals of the at least one first battery and the at least one second battery at a point at which the at least one first battery and the at least one second battery touch each other.

15 Claims, 10 Drawing Sheets

(56) References Cited

U.S. PATENT DOCUMENTS

| | | | |
|---|---|---|---|
| 7,242,973 B2 | 7/2007 | Saitoh et al. | |
| 7,926,971 B2 | 4/2011 | West et al. | |
| 8,142,926 B2 * | 3/2012 | Ke | H01M 50/213 |
| | | | 429/96 |
| 9,055,670 B2 * | 6/2015 | Su | H04M 1/0202 |
| 9,209,785 B2 | 12/2015 | Choi | |
| 10,151,432 B1 * | 12/2018 | Uke | H01M 50/227 |
| 11,985,772 B2 * | 5/2024 | Park | H05K 5/0086 |
| 2004/0053120 A1 | 3/2004 | Lee et al. | |
| 2005/0118463 A1 | 6/2005 | Okachi | |
| 2005/0122715 A1 | 6/2005 | Furth et al. | |
| 2005/0276042 A1 | 12/2005 | Ho | |
| 2010/0086840 A1 | 4/2010 | Shao | |
| 2014/0342206 A1 | 11/2014 | Iwao et al. | |
| 2017/0149045 A1 | 5/2017 | Neil | |
| 2018/0004472 A1 | 1/2018 | Sundholm et al. | |
| 2018/0206954 A1 | 7/2018 | Fugger et al. | |
| 2021/0153365 A1 | 5/2021 | Mikawa | |

\* cited by examiner

BATTERY CASE AND ELECTRONIC PRICE INDICATOR INCLUDING THE SAME

CROSS-REFERENCE TO RELATED APPLICATIONS

This application is a continuation of U.S. patent application Ser. No. 17/661,068, filed Apr. 28, 2022, which is based on and claims priority under 35 U.S.C. § 119 to Korean Patent Applications Nos. 10-2021-0055954, filed on Apr. 29, 2021, in the Korean Intellectual Property Office, and 10-2022-0030333, filed on Mar. 10, 2022, in the Korean Intellectual Property Office, the disclosures of which are incorporated by reference herein in their entireties.

BACKGROUND

1. Field

One or more embodiments relate to a battery case and an electronic price indicator including the same, and more particularly, to a battery case for preventing contact between same terminals due to incorrect insertion of a battery and an electronic price indicator including the battery case.

2. Description of the Related Art

To display and sell many products in a predetermined space, such as a distribution market, etc., labels for displaying product information, such as selling prices, sales information, places of origin, etc., are used.

Previously, paper labels with product information printed on paper in a standardized form were mainly used. However, in the case of paper labels, when product information such as prices is changed, correction of the product information or replacement of the paper labels by new paper labels is needed. Thus, in a large distribution market, etc. where there are a large number of products and where changes in the product information frequently occur, the need for a replacement means for the paper labels has emerged.

Recently, as the means for replacing the paper labels, an electronic price indicator using a method of receiving product information from a server and outputting the product information received from the server through a display has been proposed. Such an electronic price indicator is able to quickly and simply change the product information, and thus, research and development into electronic price indicators has gradually increased.

SUMMARY

An electronic price indicator may operate to display product information through a display, and thus, for the operation of the electronic price indicator, a power portion to supply electricity to the display is essential.

Generally, as the power portion, the electronic price indicator uses AA-sized or AAA-sized batteries that are serially connected. However, when at least one of the batteries is inserted in a wrong direction due to a mistake or carelessness of a user, safety incidents may occur. For example, when at least one battery is incorrectly inserted into a battery case of the electronic price indicator, and same terminals of the batteries contact each other, safety incidents such as fire may occur due to overheating, or damage to the electronic price indicator may occur.

According to various embodiments, a battery case for preventing contact between same terminals due to incorrect insertion of a battery and an electronic price indicator including the battery case are provided, and thus, safety incidents and damage to the electronic price indicator caused by incorrect insertion of a battery, may be prevented.

The objectives to be solved by embodiments are not limited to the objectives described above, and the tasks that are not mentioned may be clearly understood by one of ordinary skill in the art from the specification and the accompanying drawings.

Additional aspects will be set forth in part in the description which follows and, in part, will be apparent from the description, or may be learned by practice of the presented embodiments of the disclosure.

According to one or more embodiments, a battery case includes: a first battery accommodating portion accommodating at least one first battery; a second battery accommodating portion arranged apart from the first battery accommodating portion and accommodating at least one second battery serially connected with the at least one first battery; a rail arranged between the first battery accommodating portion and the second battery accommodating portion; and a structure configured to move along the rail between the first battery accommodating portion and the second battery accommodating portion and prevent contact between same terminals of the at least one first battery and the at least one second battery at a point at which the at least one first battery and the at least one second battery touch each other.

The rail may be arranged to connect a point of the first battery accommodating portion with a point of the second battery accommodating portion.

The first battery accommodating portion and the second battery accommodating portion may have a first height, and the rail may have a second height that is less than the first height, so that there may be a step difference between the rail and the first and second battery accommodating portions.

The first and second battery accommodating portions and the rail may have a same height.

The structure may include: a first portion configured to slidingly move along the rail; and a second portion protruding from an area of the first portion and configured to prevent contact between same terminals of the at least one first battery and the at least one second battery.

The first battery accommodating portion, the rail, and the second battery accommodating portion may be integral with one another.

The rail may include a groove extending along a side wall of the battery case.

The structure may include a protrusion accommodated in the groove, and with the protrusion of the structure slidingly moving along the groove, the structure may move between the first battery accommodating portion and the second battery accommodating portion.

The structure may be arranged to not interfere with contact between a first terminal of the at least one first battery and a second terminal of the at least one second battery, the second terminal being opposite to the first terminal.

The structure may include at least one curved area at the point at which the at least one first battery and the at least one second battery touch each other, and the first terminal of the at least one first battery may contact the second terminal of the at least one second battery through the at least one curved area.

The second battery accommodating portion may include a rib structure configured to prevent incorrect insertion of the at least one second battery.

According to one or more embodiments, an electronic price indicator includes: a housing; a display arranged on an outer circumferential surface of the housing and configured to display visual information; and a battery case arranged on at least one area of the housing and accommodating a battery for supplying power to the display, wherein the battery case includes: a first battery accommodating portion accommodating at least one first battery; a second battery accommodating portion arranged apart from the first battery accommodating portion and accommodating at least one second battery serially connected with the at least one first battery; a rail arranged between the first battery accommodating portion and the second battery accommodating portion; and a structure configured to move along the rail between the first battery accommodating portion and the second battery accommodating portion and configured to prevent contact between same terminals of the at least one first battery and the at least one second battery at a point at which the at least one first battery and the at least one second battery touch each other.

The first battery accommodating portion and the second battery accommodating portion may have a first height, and the rail may have a second height that is less than the first height, so that there may be a step difference between the rail and the first and second battery accommodating portions.

The structure may include: a first portion configured to slidingly move along the rail; and a second portion protruding from an area of the first portion and configured to prevent contact between same terminals of the at least one first battery and the at least one second battery.

The second portion may be arranged to not interfere with contact between a first terminal of the at least one first battery and a second terminal of the at least one second battery, the second terminal being opposite to the first terminal.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
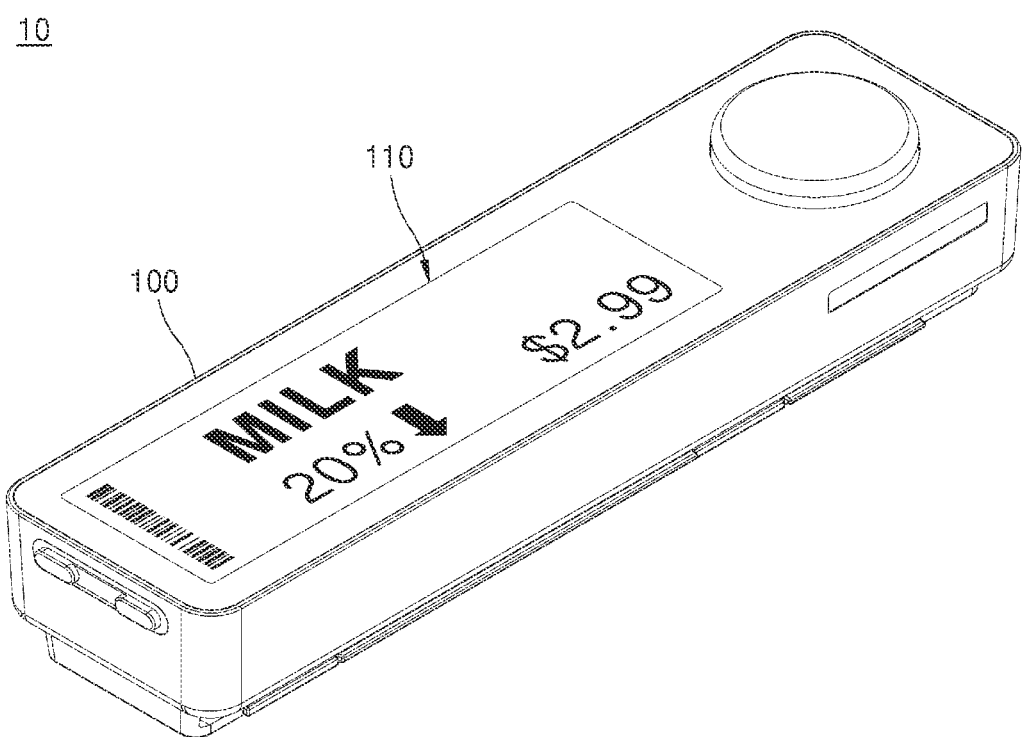
FIG. 1 is a perspective view of an electronic price indicator according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

With respect to the terms used to describe the various embodiments, general terms which are currently and widely used are selected in consideration of functions of structural elements in the various embodiments of the disclosure. However, meanings of the terms can be changed according to intention, a judicial precedence, the appearance of new technology, and the like. Thus, the terms used herein should be defined not based on the names thereof but based on the meanings thereof and the whole context of the disclosure. Throughout the specification, it will be understood that when an element is referred to as "including" another element, the element may further include other elements unless mentioned otherwise.

In addition, unless explicitly described to the contrary, the word "comprise" and variations such as "comprises" or "comprising" will be understood to imply the inclusion of stated elements but not the exclusion of any other elements. In addition, the terms "-er", "-or", and "module" described in the specification mean units for processing at least one function and operation and can be implemented by hardware components or software components and combinations thereof.

As used in this specification, when an expression, such as "at least one," is laid before arranged components, the expression does not modify each of the arranged components, but modifies all of the components. For example, the expression "at least one of a, b, and c" shall be interpreted to include "a," "b," "c," "a and b," "a and c," "b and c," or "a, b, and c."

Hereinafter, the disclosure will now be described more fully with reference to the accompanying drawings, in which exemplary embodiments of the disclosure are shown such that one of ordinary skill in the art may easily work the disclosure. The disclosure may be implemented in a form in which electronic price indicators according to various embodiments may be realized or various different forms and is not limited to the embodiments described herein.

FIG. 1 is a perspective view of an electronic price indicator 10 according to an embodiment.

Referring to FIG. 1, the electronic price indicator 10 according to an embodiment may be arranged or coupled to a product display stand in a distribution place and may display information about a product (hereinafter, "product information"). For example, the electronic price indicator 10 may receive the product information from a server (not shown) and may visually display the product information received from the server and provide the product information to a user. The electronic price indicator 10 may also be referred to as an electronic shelf label (ESL) or an electronic information label (EIL) according to an embodiment.

According to an embodiment, the electronic price indicator 10 may include a housing 100 and a display 110.

The housing 100 may form the general exterior of the electronic price indicator 10, and components of the electronic price indicator 10 may be arranged in an inner space of the housing 100. For example, a printed circuit board (not shown) including a processor for controlling operations of the electronic price indicator 10, a communication module (not shown) for wireless communication with a server, and/or a battery (not shown) may be arranged in the inner space of the housing 100. However, the disclosure is not limited thereto.

According to an embodiment, the housing 100 may generally have a rectangular shape as illustrated in FIG. 1. However, the shape of the housing 100 is not limited to the shape illustrated according to an embodiment. According to another embodiment, the housing 100 may have a polygonal cylindrical shape, rather than a rectangular shape.

The display 110 may be arranged such that at least an area thereof is exposed to an outer circumferential surface of the housing 100 and may output visual information. For example, the display 110 may output product information received from a server, but the display 10 is not limited thereto. In this disclosure, the "product information" may include at least one of a product price, a manufacturer, a place or origin, sales information, and identification information (e.g., a barcode or a QR code), and the corresponding expression may have the same meaning, hereinafter.

The display 110 may output the product information by using power supplied from a battery accommodated in the inner space of the housing 100. Hereinafter, a structure of the inner space of the housing 100 for accommodating the battery is described by referring to FIGS. 2 and 3.

Figure 2:
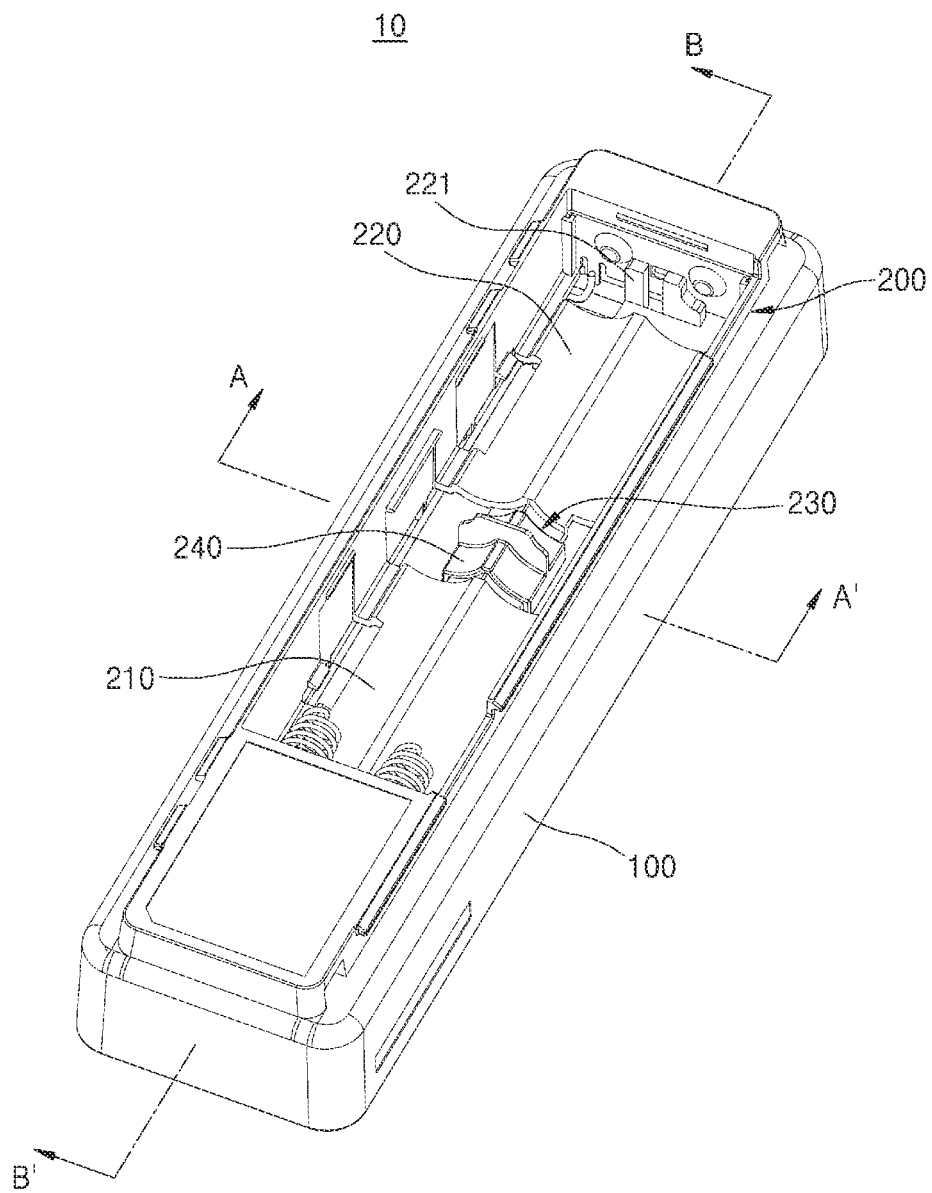
FIG. 2 is a perspective view of a battery case of an electronic price indicator according to an embodiment.

FIG. 2 is a perspective view of a battery case 200 of an electronic price indicator 10 according to an embodiment. Here, FIG. 2 illustrates the battery case 200, a battery cover of which is removed.

Referring to FIG. 2, the electronic price indicator 10 (for example, the electronic price indicator 10 of FIG. 1) according to an embodiment may include a housing 100 (for example, the housing 100 of FIG. 1) and the battery case 200 for accommodating batteries that are serially connected with each other. At least one of components of the electronic price indicator 10 according to an embodiment may be the same or substantially the same as at least one of components of the electronic price indicator 10 illustrated in FIG. 1, and hereinafter, the same descriptions are not given.

The battery case 200 may be disposed in an inner space of the housing 100 and may accommodate at least one battery for supplying power to the components of the electronic price indicator 10. For example, the battery case 200 may be arranged in an area of the housing 100 that is the opposite to an area of the housing, in which a display (for example, the display 110 of FIG. 1) is arranged, and may accommodate at least one battery. However, the battery case 200 is not limited thereto.

According to an embodiment, the battery case 200 may include a first battery accommodating portion 210, a second battery accommodating portion 220, a rail 230, and a structure 240.

The first battery accommodating portion 210 may be disposed in an area of the battery case 200 and may accommodate at least one first battery. For example, the first battery accommodating portion 210 may be formed to have a shape having a curvature corresponding to an outer circumferential surface of a battery and may accommodate the at least one first battery.

The second battery accommodating portion 220 may be disposed in another area of the battery case 200 that is apart from the first battery accommodating portion 210 by a predetermined distance and may accommodate at least one second battery, which is serially connected with the at least one first battery. For example, the second battery accommodating portion 220 may be apart from the first battery accommodating portion 210 in a longitudinal direction, and as a result, an empty space may be formed between the first battery accommodating portion 210 and the second battery accommodating portion 220.

In this disclosure, a "predetermined distance" may denote a distance allowing the at least one first battery accommodated in the first battery accommodating portion 210 and the at least one second battery accommodated in the second battery accommodating portion 220 to be serially connected with each other, and the corresponding expression may have the same meaning, hereinafter. Also, in this disclosure, the at least one first battery and the at least one second battery may include AA batteries or AAA batteries, but they are not limited thereto.

According to an embodiment, the second battery accommodating portion 220 may include a rib structure 221 for preventing incorrect insertion of the at least one second battery. The rib structure 221 may protrude from an area of the second battery accommodating portion 220 and may prevent the at least one second battery from being inserted in an opposite direction. For example, the rib structure 221 may protrude from the second battery accommodating portion 220 and may allow contact between a terminal of the second battery accommodating portion 220 and a first terminal (for example, a positive (+) terminal) of the at least one second battery but may prevent contact between the terminal of the second battery accommodating portion 220 and a second terminal (for example, a negative (−) terminal) of the at least one second battery.

In this disclosure, the "first terminal" may denote the positive (+) terminal of the battery, which is a protruding terminal, and the "second terminal" may denote the negative (−) terminal of the battery, which is a flat terminal. These expressions may have the same meaning, hereinafter.

The rail 230 may be disposed between the first battery accommodating portion 210 and the second battery accommodating portion 220 and may connect a point of the first battery accommodating portion 210 with a point of the second battery accommodating portion 220. For example, the rail 230 may extend from a point of the first battery accommodating portion 210 to a point of the second battery accommodating portion 220 in a longitudinal direction of the battery case 200 and may connect the first battery accommodating portion 210 with the second battery accommodating portion 220.

According to an embodiment, the first battery accommodating portion 210, the second battery accommodating portion 220, and the rail 230 may be integrally formed with one another, but they are not limited thereto.

Along the rail 230, the structure 240 may move between the first battery accommodating portion 210 and the second battery accommodating portion 220 and may prevent contact between same terminals (or matching terminal) of the at least one first battery and the at least one second battery. For example, when the at least one first battery is accommodated in the first battery accommodating portion 210, and the at least one second battery is accommodated in the second battery accommodating portion 220, the structure 240 may be disposed at a point at which the at least one first battery and the at least one second battery touch each other, and may prevent contact between same terminals of the at least one first battery and the at least one second battery.

When the at least one first battery and/or the at least one second battery are/is incorrectly inserted, and the same terminals of the at least one first battery and the at least one second battery contact each other, fire may occur due to overheating, or the electronic price indicator 10 may have mal-function or may be damaged.

According to the electronic price indicator 10 according to an embodiment, when the at least one first battery and/or the at least one second battery are/is incorrectly inserted, the structure 240 may prevent contact between same terminals thereof, and thus, safety incidents or damage to the electronic price indicator 10, due to incorrect insertion of the batteries, may be prevented.

Also, the electronic price indicator 10 according to an embodiment may prevent contact between the same terminals of batteries, regardless of sizes of the batteries. For example, there may be slight differences in the sizes of batteries, depending on each battery manufacturer. In this case, when the structure 240 is fixed in the battery case 200, the size or the structure of the structure 240 may have to be changed, according to the sizes of the batteries. However, according to the electronic price indicator 10 according to an embodiment, the structure 240 may move along the rail 230, and thus, even when the sizes of the batteries are changed, the structure 240 may prevent contact between same terminals of the batteries, without its size and structure being changed.

Hereinafter, structures of the rail 230 and the structure 240 are described in detail with reference to FIGS. 3 and 4.

Figure 3:
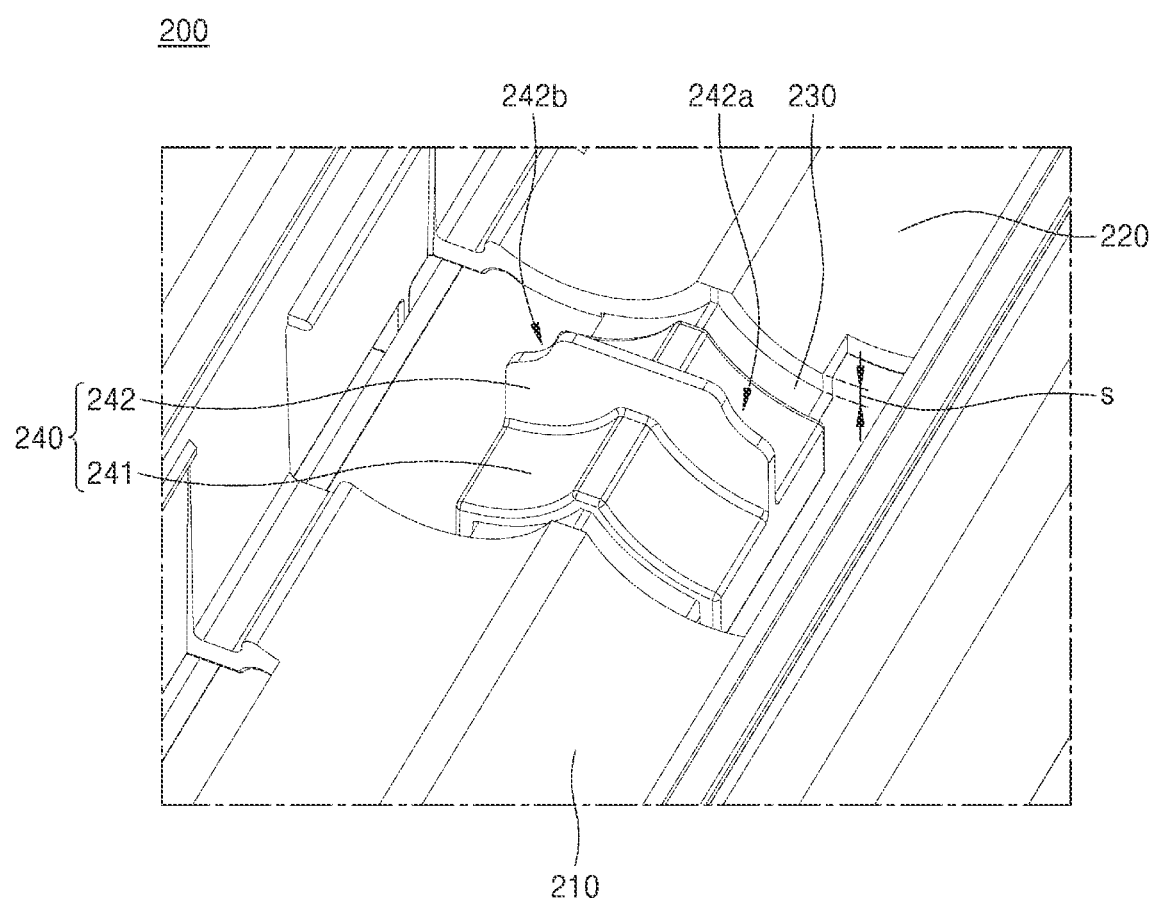
FIG. 3 is an enlarged view of an area of the electronic price indicator illustrated in FIG. 2.

FIG. 3 is an enlarged view of an area of the electronic price indicator 10 illustrated in FIG. 2. Here, FIG. 3 illustrates an area of the battery case 200 of the electronic price indicator 10 of FIG. 2, the area being peripheral to the structure 240, and hereinafter, the same descriptions are not given.

Referring to FIG. 3, a structure 240 (for example, the structure 240 of FIG. 2) of a battery case 200 (for example, the battery case 200 of FIG. 2) may move along a rail 230 (for example, the rail 230 of FIG. 2), and when at least one first battery or at least one second battery is incorrectly inserted, the structure 240 may prevent contact between same terminals of the at least one first battery and the at least one second battery.

According to an embodiment, the structure 240 may include a first portion 241 configured to slidingly move along the rail 230 and a second portion 242 configured to protrude from an area of the first portion 241 and prevent contact between same terminals of the at least one first battery and the at least one second battery.

The first portion 241 may be movably coupled to the rail 230, and may slidingly move between the first battery accommodating portion 210 and the second battery accommodating portion 220 when the at least one first battery is accommodated in the first battery accommodating portion 210, or the at least one second battery is accommodated in the second battery accommodating portion 220.

According to an embodiment, an area of the first portion 241, the area contacting the at least one first battery and/or the at least one second battery, may have a shape having a predetermined curvature, and as a result, the at least one first battery and/or the at least one second battery may be accommodated in the first battery accommodating portion 210 and/or the at least one second battery accommodating portion 220 without being interrupted by the first portion 241.

The second portion 242 may protrude from an area of the first portion 241 and may prevent contact between same terminals of the at least one first battery and the at least one second battery when the at least one first battery and/or the at least one second battery are/is incorrectly inserted For example, the second portion 242 may be disposed at a point at which the at least one first battery and the at least one second battery touch each other and may prevent contact between a second terminal (for example, a negative (−) terminal) of the at least one second battery and a second terminal of the at least one first battery.

The structure 240 may be arranged to prevent contact between the same terminals of the at least one first battery and the at least one second battery and to not interfere with contact between a first terminal of the at least one first battery and the second terminal of the at least one second battery, which is the opposite to a first terminal of the at least one second battery.

According to an embodiment, the second portion 242 of the structure 240 may include curved areas 242a and 242b formed at the point at which the at least one first battery and the at least one second battery touch each other. In this disclosure, the "curved areas 242a and 242b" may denote areas of the second portion 242 that are filleted so that the first terminal of the at least one first battery and the second terminal of the at least one second battery may be serially connected with each other, and the corresponding expression may have the same meaning, hereinafter.

The curved areas 242a and 242b may be disposed at an area at which the first terminal of the at least one first battery and the second terminal of the at least one second battery touch each other, and the first terminal of the at least one first battery and the second terminal of the at least one second battery may contact each other through the curved areas 242a and 242b.

That is, by having the structure described above, the structure 240 may not interfere with serial connection between the at least one first battery and the at least one second battery when the at least one first battery and the at least one second battery are inserted in a normal direction.

According to an embodiment, a step difference s may be formed between the first battery accommodating portion 210 and/or the second battery accommodating portion 220 and the rail 230. For example, the first battery accommodating portion 210 and/or the second battery accommodating portion 220 may be formed to have a first height based on the battery case 200, and the rail 230 may be formed to have a second height, which is less than the first height, and thus, the step difference s may be formed between the first battery accommodating portion 210 and/or the second battery accommodating portion 220 and the rail 230.

Because of the step difference s described above, the first portion 241 of the structure 240 may have the same height as the first battery accommodating portion 210 and/or the second battery accommodating portion 220 or may have a relatively less height than the first battery accommodating portion 210 and/or the second battery accommodating portion 220.

For example, when the first portion 241 of the structure 240 has a relatively greater height than the first battery accommodating portion 210 and/or the second battery accommodating portion 220, accommodation of the at least one first battery or the at least one second battery may be interrupted or interfered with by the first portion 241 of the structure 240.

Because the electronic price indicator 10 according to an embodiment may have the step difference s between the first battery accommodating portion 210 or the second battery accommodating portion 220 and the rail 230, the at least one first battery or the at least one second battery may not get caught in the structure 240 and may be accommodated in the first battery accommodating portion 210 or the second battery accommodating portion 220.

That is, through the structure described above, the electronic price indicator 10 according to an embodiment may not interrupt (or interfere with) the accommodation of the at least one first battery or the at least one second battery in the first battery accommodating portion 210 or the second battery accommodating portion 220 and may prevent contact between same terminals of the at least one first battery and the at least one second battery.

Figure 4:
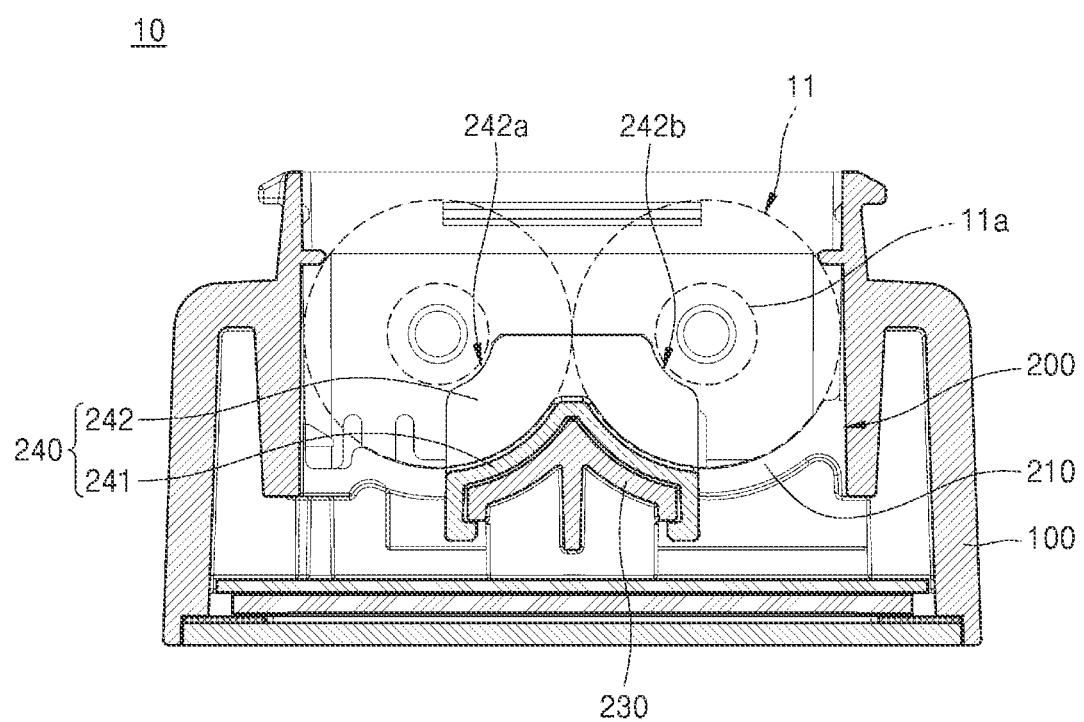
FIG. 4 is a transverse cross-sectional view of the electronic price indicator of FIG. 2.

FIG. 4 is a cross-sectional view of the electronic price indicator 10 illustrated in FIG. 2, taken in a transverse direction. That is, FIG. 4 is a cross-sectional view of the electronic price indicator 10 illustrated in FIG. 2, taken in an A-A' direction.

Referring to FIG. 4, an electronic price indicator 10 (for example, the electronic price indicator 10 of FIG. 2) according to an embodiment may include a housing 100 (for example, the housing 100 of FIG. 2) and a battery case 200 (for example, the battery case 200 of FIG. 2) disposed in an inner space of the housing 100. At least one of components of the electronic price indicator 10 according to an embodiment may be the same or substantially the same as at least one of components of the electronic price indicator 10 illustrated in FIG. 2 and/or FIG. 3, and hereinafter, the same descriptions are not given.

The battery case 200 may include a rail 230 (for example, the rail 230 of FIGS. 2 and 3) and a structure 240 (for example, the structure 240 of FIGS. 2 and 3) configured to slidingly move and prevent contact between same terminals of at least one first battery 11 and at least one second battery (not shown).

According to an embodiment, the structure 240 may include a first portion 241 (for example, the first portion 241 of FIG. 3) movably coupled to the rail 230 and a second portion 242 (for example, the second portion 242 of FIG. 3) protruding from an area of the first portion 241 and disposed at a point at which the at least one first battery 11 and the at least one second battery touch each other.

The first portion 241 of the structure 240 may be movably coupled to the rail 230, and when the at least one first battery 11 is accommodated in a first battery accommodating portion 210 (e.g., the first battery accommodating portion 210 of FIGS. 2 and 3) or the at least one second battery is accommodated in a second battery accommodating portion (not shown) (for example, the second battery accommodating portion 220 of FIGS. 2 and 3), may slidingly move between the first battery accommodating portion 210 and the second battery accommodating portion.

According to an embodiment, an area of the first portion 241, the area contacting the at least one first battery 11 and/or the at least one second battery, may be formed to have a predetermined curvature. For example, the area of the first portion 241, the area contacting the at least one first battery 11 and/or the at least one second battery, may have a shape having a curvature corresponding to an outer circumferential surface of the at least one first battery 11. Based on this structure of the first portion 241 described above, the at least one first battery 11 and/or the at least one second battery may be accommodated in the first battery accommodating portion 210 and/or the second battery accommodating portion without being interfered with or interrupted by the first portion 241.

The second portion 242 of the structure 240 may protrude from a central area of the first portion 241 in a longitudinal direction of the first portion 241 and may prevent contact between same terminals of the at least one first battery 11 and the at least one second battery. For example, the second portion 242 may be disposed at a point at which the at least one first battery 11 and the at least one second battery touch each other, and when the at least one first battery 11 is incorrectly inserted, the second portion 242 may prevent contact between a second terminal of the at least one second battery and a second terminal of the at least one first battery 11.

According to an embodiment, the second portion 242 may be arranged to prevent contact between same terminals of the at least one first battery 11 and the at least one second battery and to not interfere with contact between different terminals of the at least one first battery 11 and the at least one second battery.

For example, when the at least one first battery 11 is accommodated in the first battery accommodating portion 210, the second portion 242 may include curved areas 242a and 242b at a point corresponding to a first terminal 11a of the at least one first battery 11.

The curved areas 242a and 242b may be disposed not to contact the first terminal 11a of the at least one first battery 11, and as a result, the first terminal 11a of the at least one first battery 11 may pass through the curved areas 242a and 242b of the second portion 242 and may contact the second terminal of the at least one second battery.

Hereinafter, the function of the structure 240 according to an insertion direction of the at least one first battery 11 is described in more detail with reference to FIGS. 5A and 5B.

Figure 5A:
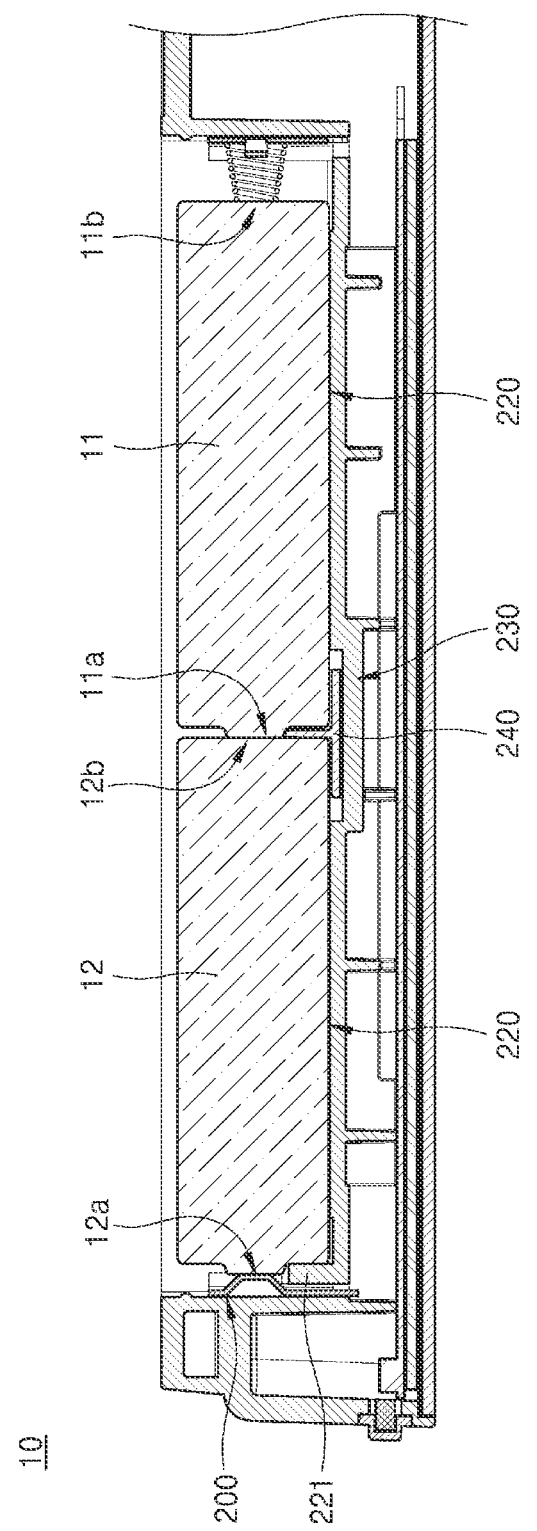
FIG. 5A is a cross-sectional view showing a state in which a battery is properly inserted into a battery case of an electronic price indicator, according to an embodiment.
Figure 5B:
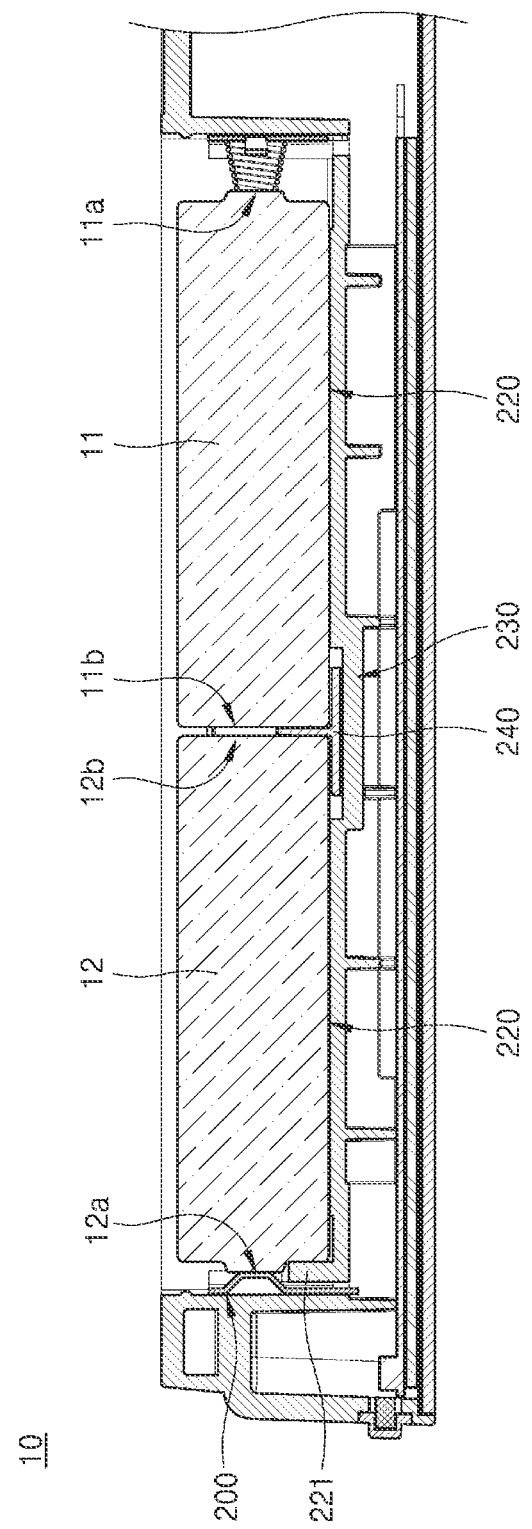
FIG. 5B is a cross-sectional view showing a state in which a battery is incorrectly inserted into a battery case of an electronic price indicator, according to an embodiment.

FIG. 5A is a cross-sectional view illustrating a state in which a battery is properly inserted into a battery case of an electronic price indicator according to an embodiment, and FIG. 5B is a cross-sectional view illustrating a state in which a battery is incorrectly inserted into a battery case of an electronic price indicator according to an embodiment. Here, FIGS. 5A and 5B are cross-sectional views of the electronic price indicator 10 illustrated in FIG. 2, taken in a B-B' direction.

Referring to FIGS. 5A and 5B, a battery case 200 of an electronic price indicator 10 according to an embodiment may include a first battery accommodating portion 210, a second battery accommodating portion 220, a rib structure 221, a rail 230, and a structure 240. At least one of components of the electronic price indicator 10 according to an embodiment may be the same or substantially the same as at least one of components of the electronic price indicator 10 illustrated in FIGS. 2 through 4, and hereinafter, the same descriptions are not given.

The rib structure 221 may protrude from an area of the second battery accommodating portion 220 and may prevent incorrect insertion of at least one second battery 12. For example, the rib structure 221 may be disposed to be adjacent to a terminal disposed on a side surface of the second battery accommodating portion 220, and when the at least one second battery 12 is inserted into the second battery accommodating portion 220 in a wrong direction, may prevent contact between a second terminal 12b of the at least one second battery 12 and the terminal of the second battery accommodating portion 220.

However, when the at least one second battery 12 is inserted into the second battery accommodating portion 220 in a normal direction, a first terminal 12a of the at least one second battery 12 may protrude from an area of the at least one second battery 12 in a direction toward the terminal of the second battery accommodating portion 220 and may contact the terminal of the second battery accommodating portion 220.

That is, in the electronic price indicator 10 according to an embodiment, when the at least one second battery 12 is inserted into the second battery accommodating portion 220, the rib structure 221 may allow the first terminal 12a of the at least one second battery 12 to contact the terminal of the second battery accommodating portion 220.

When the at least one first battery 11 is inserted into the first battery accommodating portion 210, or the at least one second battery 12 is inserted into the second battery accommodating portion 220, the structure 240 may move along the rail 230 between the first battery accommodating portion 210 and the second battery accommodating portion 220 and may prevent contact between same terminals of the at least one first battery 11 and the at least one second battery 12.

For example, the structure 240 may be arranged at a point at which the at least one first battery 11 and the at least one second battery 12 touch each other to allow contact between different terminals of the at least one first battery 11 and the at least one second battery 12 and not to allow contact between same terminals of the at least one first battery 11 and the at least one second battery 12.

Referring to FIG. 5A, when the at least one first battery 11 and the at least one second battery 12 are inserted into the first battery accommodating portion 210 and the second battery accommodating portion 220, respectively, in normal directions, a first terminal 11a of the at least one first battery 11 may pass through the structure 240 and contact the second terminal 12b of the at least one second battery 12. For example, the first terminal 11a of the at least one first battery 11 may protrude from an area of the at least one first battery 11 and may pass by curved areas (for example, the curved areas 242a and 242b of FIG. 4) of the structure 240 and may contact the second terminal 12b of the at least one second battery 12.

Referring to FIG. 5B, when the at least one first battery 11 is incorrectly inserted into the first battery accommodating portion 210, the structure 240 may prevent contact between a second terminal 11b of the at least one first battery 11 and the second terminal 12b of the at least one second battery 12. For example, the structure 240 may be disposed at a point at which the at least one first battery 11 and the at least one second battery 12 touch each other and may prevent contact between the second terminal 11b of the at least one first battery 11 and the second terminal 12b of the at least one second battery 12.

That is, in the electronic price indicator 10 according to an embodiment, the structure 240 may allow contact between different terminals of the at least one first battery 11 and the at least one second battery 12 and may prevent contact between same terminals of the at least one first battery 11 and the at least one second battery 12. Thus, safety incidents (for example, fire due to overheating) due to incorrect insertion of the first and second batteries 11 and 12 may be prevented.

Figure 6:
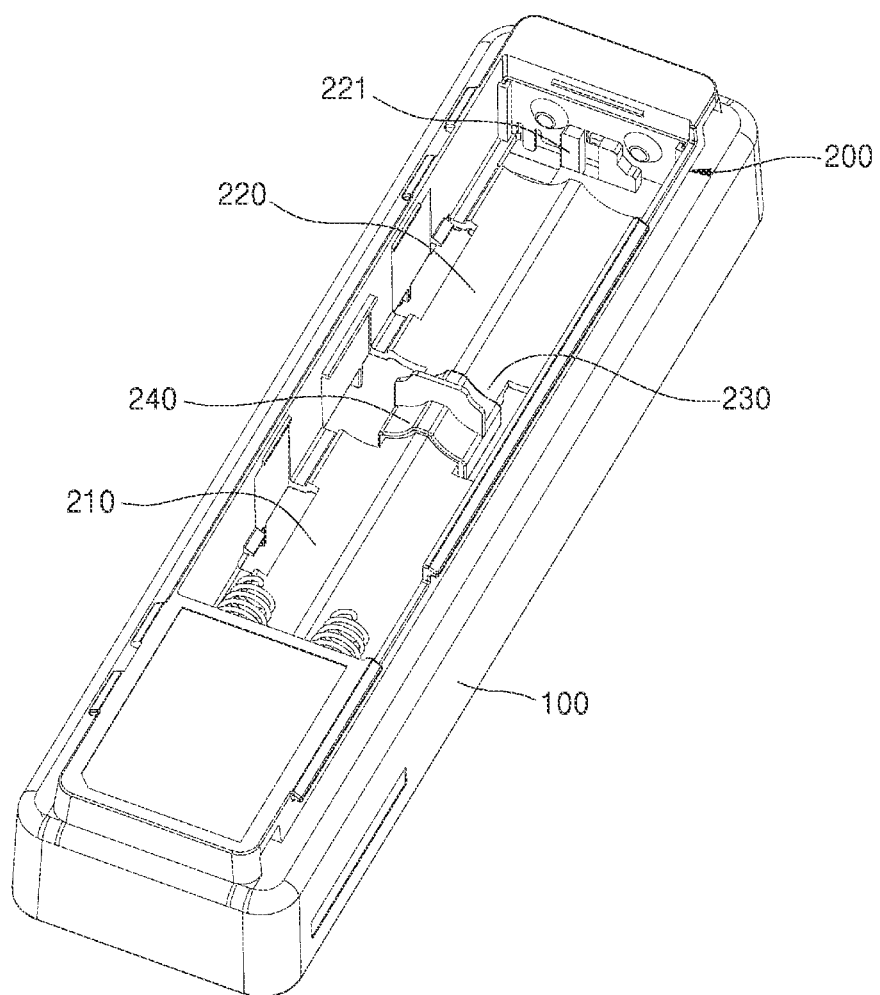
FIG. 6 is a perspective view of a battery case of an electronic price indicator according to another embodiment.
Figure 7:
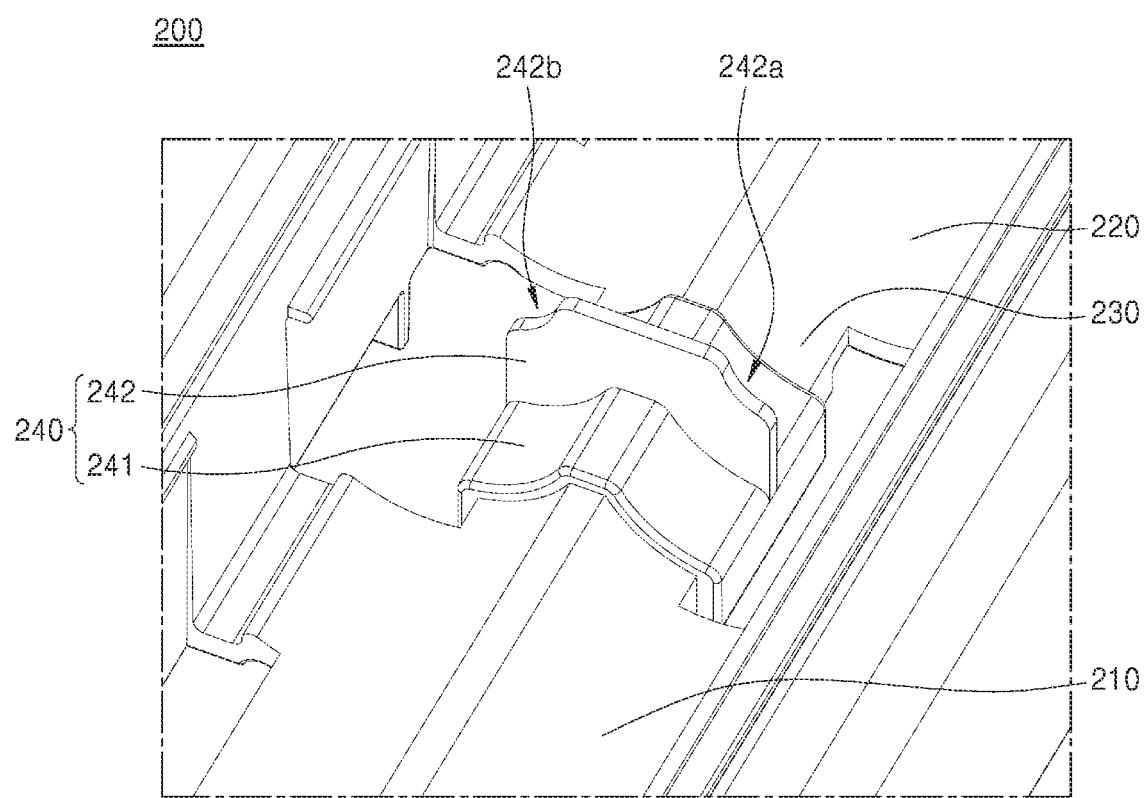
FIG. 7 is an enlarged view of an area of the electronic price indicator illustrated in FIG. 6.

FIG. 6 is a perspective view of a battery case 200 of an electronic price indicator 10 according to another embodiment, and FIG. 7 is an enlarged view of an area of the electronic price indicator 10 illustrated in FIG. 6.

Referring to FIGS. 6 and 7, the electronic price indicator 10 according to another embodiment may include a housing 100 and the battery case 200 disposed in an inner space of the housing 100 and accommodating batteries that are serially connected. The electronic price indicator 10 according to another embodiment may correspond to the electronic price indicator 10 of FIGS. 2 through 4, in which the first battery accommodating portion 210, the second battery accommodating portion 220, and the rail 230 have changed shapes, and hereinafter, the same descriptions are not given.

The battery case 200 may be disposed in the inner space of the housing 100 and may accommodate at least one battery for suppling power to components of the electronic price indicator 10. For example, the battery case 200 may accommodate batteries that are serially connected, and the serially connected batteries may supply power to the components (for example, the display 110 of FIG. 1) of the electronic price indicator 10.

According to an embodiment, the battery case 200 may include a first battery accommodating portion 210, a second battery accommodating portion 220, a rail 230, and a structure 240.

The first battery accommodating portion 210 may be disposed in an area of the battery case 200 and may accommodate at least one first battery. For example, the first battery accommodating portion 210 may have a shape having a curvature corresponding to an outer circumferential surface of a battery and may accommodate at least one first battery.

The second battery accommodating portion 220 may be disposed in another area of the battery case 200, which is apart from the first battery accommodating portion 210 by a predetermined distance, and may accommodate at least one second battery. For example, the second battery accommodating portion 220 may be apart from the first battery accommodating portion 210 in a longitudinal direction of the battery case 200 and may accommodate the at least one second battery serially connected with the at least one first battery.

According to an embodiment, the second battery accommodating portion 220 may include a rib structure 221 for preventing incorrect insertion of the at least one second battery. The rib structure 221 may protrude from an area of the second battery accommodating portion 220 and may prevent the at least one second battery from being inserted in an opposite direction. For example, the rib structure 221 may protrude from the second battery accommodating portion 220 and may allow contact between a terminal of the second battery accommodating portion 220 and a first terminal (for example, a positive (+) terminal) of the at least one second battery and may prevent contact between the terminal of the second battery accommodating portion 220 and a second terminal (for example, a negative (−) terminal) of the at least one second battery.

The rail 230 may be disposed between the first battery accommodating portion 210 and the second battery accommodating portion 220 and may connect a point of the first battery accommodating portion 210 with a point of the second battery accommodating portion 220.

As illustrated in FIGS. 6 and 7, the rail 230 may have the same height as the first battery accommodating portion 210 and the second battery accommodating portion 220. For example, the first battery accommodating portion 210, the second battery accommodating portion 220, and the rail 230 may have the same height based on the battery case 200, and thus, there may be no step difference between the first battery accommodating portion 210 and the rail 230 or between the second battery accommodating portion 220 and the rail 230.

Because the first battery accommodating portion 210, the second battery accommodating portion 220, and the rail 230 may have the same height in the electronic price indicator 10 according to another embodiment, a process of forming a step difference may be omitted in a manufacturing process of the battery case 200. That is, according to the electronic price indicator 10 according to another embodiment, manufacturing costs may be reduced, based on the structure described above.

The structure 240 may move along the rail 230 between the first battery accommodating portion 210 and the second battery accommodating portion 220 and may prevent contact between same terminals of the at least one first battery and the at least one second battery. For example, when the at least one first battery is accommodated in the first battery accommodating portion 210, and the at least one second battery is accommodated in the second battery accommodating portion 220, the structure 240 may be disposed at a point at which the at least one first battery and the at least one second battery touch each other, and may prevent contact between same terminals of the at least one first battery and the at least one second battery.

According to an embodiment, the structure 240 may include a first portion 241 configured to slidingly move along the rail 230 and a second portion 242 configured to protrude from an area of the first portion 241 and prevent contact between same terminals of the at least one first battery and the at least one second battery.

The first portion 241 may be movably coupled to the rail 230, and when the at least one first battery is accommodated in the first battery accommodating portion 210, or the at least one second battery is accommodated in the second battery accommodating portion 220, the first portion 241 may slidingly move between the first battery accommodating portion 210 and the second battery accommodating portion 220.

According to an embodiment, an area of the first portion 241, the area contacting the at least one first battery and/or the at least one second battery, may have a shape having a predetermined curvature, and thus, the at least one first battery and/or the at least one second battery may be accommodated in the first battery accommodating portion 210 and/or the second battery accommodating portion 220 without being interfered with by the first portion 241.

The second portion 242 may be configured to protrude from an area of the first portion 241, and when the at least one first battery and/or the at least one second battery are/is incorrectly inserted, may prevent contact between same terminals of the at least one first battery and the at least one second battery. For example, the second portion 242 may be disposed at a point at which the at least one first battery and the at least one second battery touch each other and may prevent contact between a second terminal (for example, a negative (−) terminal) of the at least one second battery and a second terminal of the at least one first battery.

The structure 240 may be arranged to prevent contact between same terminals of the at least one first battery and the at least one second battery and to not interfere with contact between a first terminal of the at least one first battery and a second terminal of the at least one second battery, which is the opposite to a first terminal of the at least one second battery.

According to an embodiment, the second portion 242 of the structure 240 may include curved areas 242a and 242b formed at a point at which the at least one first battery and the at least one second battery touch each other. The curved areas 242a and 242b may be disposed at an area at which the first terminal of the at least one first battery and the second terminal of the at least one second battery touch each other, and the first terminal of the at least one first battery and the second terminal of the at least one second battery may contact each other through the curved areas 242a and 242b.

That is, based on the structure described above, the structure 240 may not interfere with serial connection between the at least one first battery and the at least one second battery, when the at least one first battery and the at least one second battery are inserted in a normal direction.

Figure 8:
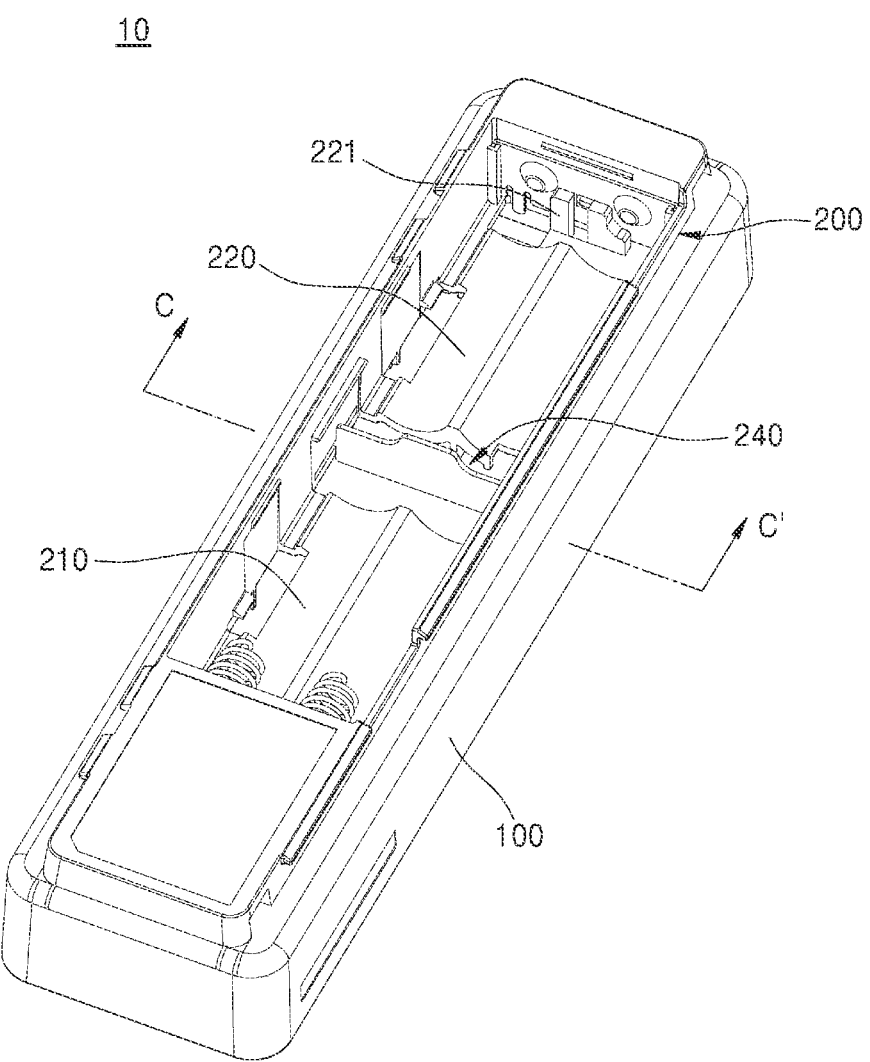
FIG. 8 is a perspective view of a battery case of an electronic price indicator according to another embodiment.
Figure 9:
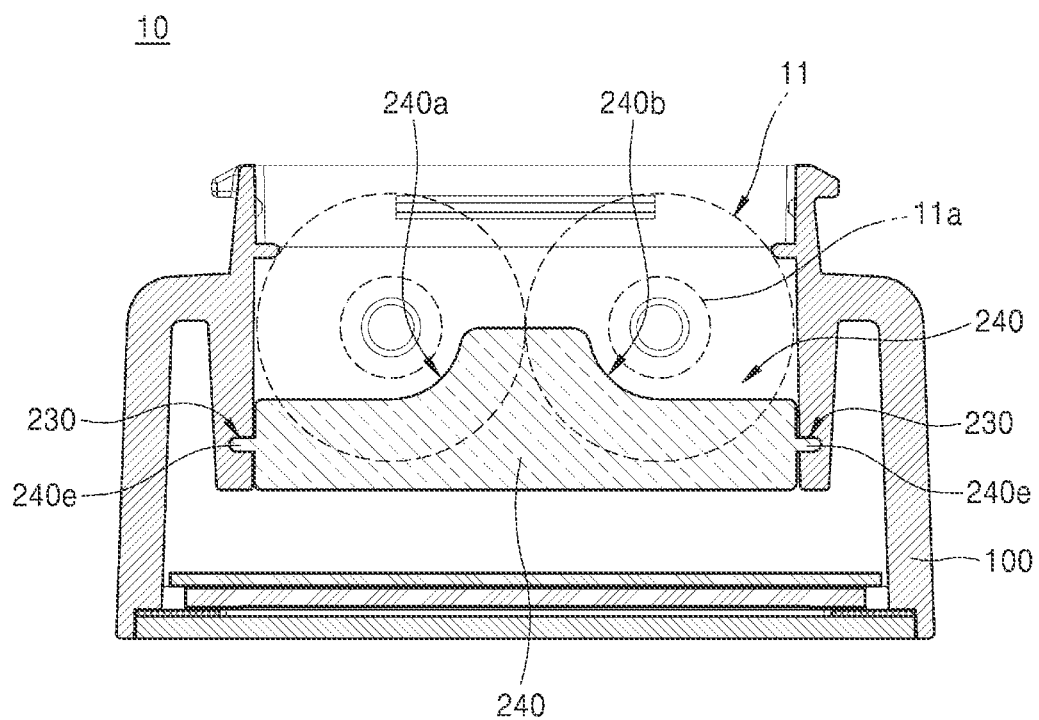
FIG. 9 is a transverse cross-sectional view of the electronic price indicator illustrated in FIG. 8.

FIG. 8 is a perspective view of a battery case 200 of an electronic price indicator 10 according to another embodiment, and FIG. 9 is a cross-sectional view of the electronic price indicator 10 illustrated in FIG. 8, taken in a transverse direction. Here, FIG. 9 is a cross-sectional view of the electronic price indicator 10 of FIG. 8, taken in a C-C' direction.

Referring to FIGS. 8 and 9, the electronic price indicator 10 according to another embodiment may include a housing 100 and the battery case 200 disposed in an inner space of the housing 100 and accommodating batteries that are serially connected. The electronic price indicator 10 according to another embodiment may correspond to the electronic price indicator 10 of FIGS. 2 through 4, in which the rail 230 may have a changed arrangement structure and the structure 240 may have a changed shape, and hereinafter, the same descriptions are not given.

The battery case 200 may be disposed in the inner space of the housing 100 and may accommodate at least one battery for supplying power to components of the electronic price indicator 10. For example, the battery case 200 may be disposed in an area of the housing 100 that is the opposite to an area of the housing 100, in which a display (for example, the display 110 of FIG. 1) is disposed, and may accommodate at least one battery. However, the battery case 200 is not limited thereto.

According to an embodiment, the battery case 200 may include a first battery accommodating portion 210, a second battery accommodating portion 220, a rail 230, and a structure 240.

The first battery accommodating portion 210 may be disposed in an area of the battery case 200 and may accommodate the at least one first battery. For example, the first battery accommodating portion 210 may be configured to a shape having a curvature corresponding to an outer circumferential surface of a battery and may accommodate the at least one first battery.

The second battery accommodating portion 220 may be disposed in another area of the battery case 200, which is apart from the first battery accommodating portion 210 by a predetermined distance, and may accommodate at least one second battery. For example, the second battery accommodating portion 220 may be apart from the first battery accommodating portion 210 in a longitudinal direction of the battery case 200 and may accommodate the at least one second battery that is serially connected with the at least one first battery.

According to an embodiment, the second battery accommodating portion 220 may include a rib structure 221 configured to prevent incorrect insertion of the at least one second battery. The rib structure 221 may protrude from an area of the second battery accommodating portion 220 and may prevent the at least one second battery from being inserted in an opposite direction. For example, the rib structure 221 may protrude from the second battery accommodating portion 220 and may allow contact between a terminal of the second battery accommodating portion 220 and a first terminal (for example, a positive (+) terminal) of the at least one second battery and may prevent contact between the terminal of the second battery accommodating portion 220 and a second terminal (for example, a negative (−) terminal) of the at least one second battery.

The rail 230 may be disposed in an area of a side wall of the battery case 200, and the structure 240 may slidingly move in the longitudinal direction of the battery case 200 through the rail 230.

According to an embodiment, the rail 230 may include a groove (or a recess) formed in an area of the side wall of the battery case 200 disposed between the first battery accommodating portion 210 and the second battery accommodating portion 220. At least one area of the structure 240 may be movably coupled to the rail 230, and then, may slidingly move between the first battery accommodating portion 210 and the second battery accommodating portion 220.

The structure 240 may move along the rail 230 between the first battery accommodating portion 210 and the second battery accommodating portion 220 and may prevent contact between same terminals of at least one first battery 11 and at least one second battery (not shown) (for example, the second battery 12 of FIG. 5A).

According to an embodiment, the structure 240 may include a protrusion 240e protruding from an area of the structure 240 toward the rail 230. The protrusion 240e may be movably inserted into or accommodated in the rail 230 on the side wall of the battery case 200, and as the protrusion 240e moves along the rail 230, the structure 240 may slidingly move between the first battery accommodating portion 210 and the second battery accommodating portion 220.

When the at least one first battery 11 is accommodated in the first battery accommodating portion 210, and the at least one second battery is accommodated in the second battery accommodating portion 220, the structure 240 may be disposed at a point at which the at least one first battery 11 and the at least one second battery touch each other and may prevent contact between same terminals of the at least one first battery 11 and the at least one second battery.

For example, when the at least one first battery 11 and/or the at least one second battery are/is incorrectly inserted, and thus, the same terminals of the at least one first battery 11 and the at least one second battery contact each other, fire may occur due to overheating, or the electronic price indicator 10 may mal-function or may be damaged.

The electronic price indicator 10 according to another embodiment may prevent, by using the structure 240 moving along the rail 230, contact between same terminals of the at least one first battery 11 and the at least one second battery, when the at least one first battery 11 and/or the at least one second battery are/is incorrectly inserted. Thus, safety incidents or damage to the electronic price indicator 10 due to battery incorrect insertion may be prevented.

The structure 240 may be arranged to prevent contact between same terminals of the at least one first battery 11 and the at least one second battery and to not interfere with contact between a first terminal 11a of the at least one first battery 11 and a second terminal of the at least one second battery, which is the opposite to a first terminal of the at least one second battery.

According to an embodiment, the structure 240 may include curved areas 240a and 240b formed at a point at which the at least one first battery 11 and the at least one second battery touch each other. In this disclosure, the "curved areas 240a and 240b" may denote areas of the structure 240 that are filleted to serially connect the first terminal 11a of the at least one first battery 11 with the second terminal of the at least one second battery, and the corresponding expression may have the same meaning, hereinafter.

The curved areas 240a and 240b may be arranged at an area at which the first terminal 11a of the at least one first battery 11 and second terminal of the at least one second battery touch each other not to contact the first terminal 11a of the at least one first battery 11. Thus, the first terminal 11a protruding from an area of the at least one first battery 11 may pass by the curved areas 240a and 240b and may contact the second terminal of the at least one second battery. That is, when the at least one first battery 11 and the at least one second battery are inserted in a normal direction, the structure 240 may not interfere with serial connection between the at least one first battery 11 and the at least one second battery.

The electronic price indicator 10 according to another embodiment may prevent, by using the structure 240 described above, contact between same terminals of the at last one first battery 11 and the at least one second battery, when the at least one first battery 11 and/or the at least one second battery are/is incorrectly inserted. Thus, safety incidents due to incorrect insertion may be effectively prevented.

The battery case and the electronic price indicator including the same, according to various embodiments, may prevent safety incidents caused by incorrect insertion of batteries.

Also, the battery case and the electronic price indicator including the same, according to various embodiments, may prevent contact between same terminals of batteries, regardless of sizes of the batteries.

The effects of embodiments are not limited to the effects described above, and the effects not mentioned may be clearly understood by one of ordinary skill in the art, from this specification and the accompanying drawings.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A battery case comprising:
   a first battery accommodating portion accommodating at least one first battery;
   a second battery accommodating portion arranged apart from the first battery accommodating portion and accommodating at least one second battery serially connected with the at least one first battery;
   a rail arranged between the first battery accommodating portion and the second battery accommodating portion; and
   a structure configured to move along the rail between the first battery accommodating portion and the second battery accommodating portion and prevent contact between same terminals of the at least one first battery and the at least one second battery at a point at which the at least one first battery and the at least one second battery touch each other;
   wherein step differences are respectively formed between the rail and the first battery accommodating portion, and between the rail and the second battery accommodating portion, whereby the structure is blocked from entering the first battery accommodating portion and the second battery accommodating portion by the step differences.

2. The battery case of claim 1, wherein the rail is arranged to connect a point of the first battery accommodating portion with a point of the second battery accommodating portion.

3. The battery case of claim 2, wherein the first battery accommodating portion and the second battery accommodating portion have a first height, and the rail has a second height that is less than the first height, so that there are the step differences.

4. The battery case of claim 2, wherein the first and second battery accommodating portions and the rail have a same height.

5. The battery case of claim 2, wherein the structure includes:
a first portion configured to slidingly move along the rail; and
a second portion protruding from an area of the first portion and configured to prevent contact between same terminals of the at least one first battery and the at least one second battery.

6. The battery case of claim 2, wherein the first battery accommodating portion, the rail, and the second battery accommodating portion are integral with one another.

7. The battery case of claim 1, wherein the rail includes a groove extending along a side wall of the battery case.

8. The battery case of claim 7, wherein the structure includes a protrusion accommodated in the groove, and with the protrusion of the structure slidingly moving along the groove, the structure moves between the first battery accommodating portion and the second battery accommodating portion.

9. The battery case of claim 1, wherein the structure is arranged to not interfere with contact between a first terminal of the at least one first battery and a second terminal of the at least one second battery, the second terminal being opposite to the first terminal.

10. The battery case of claim 9, wherein the structure includes at least one curved area at the point at which the at least one first battery and the at least one second battery touch each other, and the first terminal of the at least one first battery contacts the second terminal of the at least one second battery through the at least one curved area.

11. The battery case of claim 1, wherein the second battery accommodating portion includes a rib structure configured to prevent incorrect insertion of the at least one second battery.

12. An electronic price indicator comprising:
a housing;
a display arranged on an outer circumferential surface of the housing and configured to display visual information; and
a battery case arranged on at least one area of the housing and accommodating a battery for supplying power to the display,
wherein the battery case includes:
a first battery accommodating portion accommodating at least one first battery;
a second battery accommodating portion arranged apart from the first battery accommodating portion and accommodating at least one second battery serially connected with the at least one first battery;
a rail arranged between the first battery accommodating portion and the second battery accommodating portion; and
a structure configured to move along the rail between the first battery accommodating portion and the second battery accommodating portion and configured to prevent contact between same terminals of the at least one first battery and the at least one second battery at a point at which the at least one first battery and the at least one second battery touch each other;
wherein step differences are respectively formed between the rail and the first battery accommodating portion, and between the rail and the second battery accommodating portion, whereby the structure is blocked from entering the first battery accommodating portion and the second battery accommodating portion by the step differences.

13. The electronic price indicator of claim 12, wherein the first battery accommodating portion and the second battery accommodating portion have a first height, and the rail has a second height that is less than the first height, so that there are the step differences.

14. The electronic price indicator of claim 13, wherein the structure includes:
a first portion configured to slidingly move along the rail; and
a second portion protruding from an area of the first portion and configured to prevent contact between same terminals of the at least one first battery and the at least one second battery.

15. The electronic price indicator of claim 14, wherein the second portion is arranged to not interfere with contact between a first terminal of the at least one first battery and a second terminal of the at least one second battery, the second terminal being opposite to the first terminal.

* * * * *